United States Patent
Kurita et al.

(10) Patent No.: US 8,309,882 B2
(45) Date of Patent: Nov. 13, 2012

(54) MOLD REMOVING METHOD

(75) Inventors: Tsuneo Kurita, Ibaraki (JP); Nagayoshi Kasashima, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 359 days.

(21) Appl. No.: 12/744,594

(22) PCT Filed: Nov. 25, 2008

(86) PCT No.: PCT/JP2008/071303
§ 371 (c)(1),
(2), (4) Date: May 25, 2010

(87) PCT Pub. No.: WO2009/069577
PCT Pub. Date: Jun. 4, 2009

(65) Prior Publication Data
US 2010/0258544 A1  Oct. 14, 2010

(30) Foreign Application Priority Data
Nov. 26, 2007  (JP) .............................. P2007-304584

(51) Int. Cl.
*B23K 26/38* (2006.01)
(52) U.S. Cl. .................. 219/121.72; 219/121.68; 438/4
(58) Field of Classification Search .............. 219/121.72, 219/121, 121.68, 121.69; 356/630; 438/4; 257/E21.499
See application file for complete search history.

(56) References Cited

U.S. PATENT DOCUMENTS

| | | | |
|---|---|---|---|
| 6,335,208 B1 * | 1/2002 | Lowry | 438/4 |
| 6,579,376 B1 * | 6/2003 | Ikkai et al. | 134/1 |
| 2009/0011522 A1 * | 1/2009 | Drennan et al. | 438/4 |

FOREIGN PATENT DOCUMENTS

| | | |
|---|---|---|
| JP | 3-44043 | 2/1991 |
| JP | 4-171833 | 6/1992 |
| JP | 5-243296 | 9/1993 |
| JP | 5-251490 | 9/1993 |
| JP | 10-199906 | 7/1998 |
| JP | 11-254270 | 9/1999 |
| JP | 2000-21912 | 1/2000 |
| JP | 2000-146537 | 5/2000 |
| JP | 2000-323506 | 11/2000 |
| JP | 2005-19818 | 1/2005 |

* cited by examiner

*Primary Examiner* — Roy Potter
(74) *Attorney, Agent, or Firm* — Morgan, Lewis & Bockius LLP

(57) ABSTRACT

A laser mold removing method of the invention is for processing a composite material composed of a plurality of materials having different reflectances to a laser beam, and includes emitting laser beam in which a processing laser beam for processing the processing object and a measurement laser beam adapted to irradiate the processing object and having an output smaller than that of the processing laser beam are emitted, measuring a reflected light quantity of the measurement laser beam reflected by the processing object, and controlling based on the reflected light quantity.

6 Claims, 17 Drawing Sheets

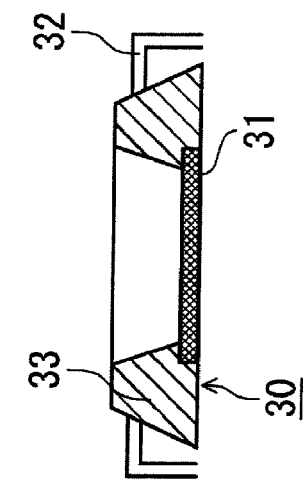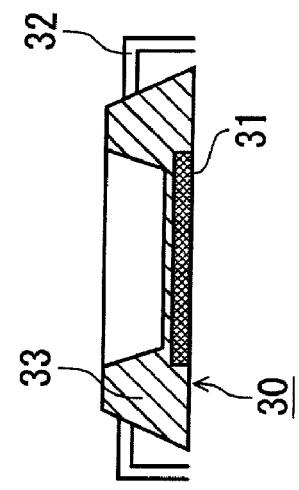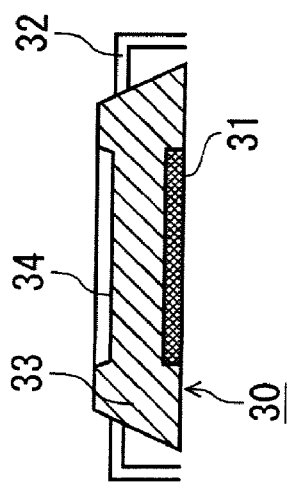

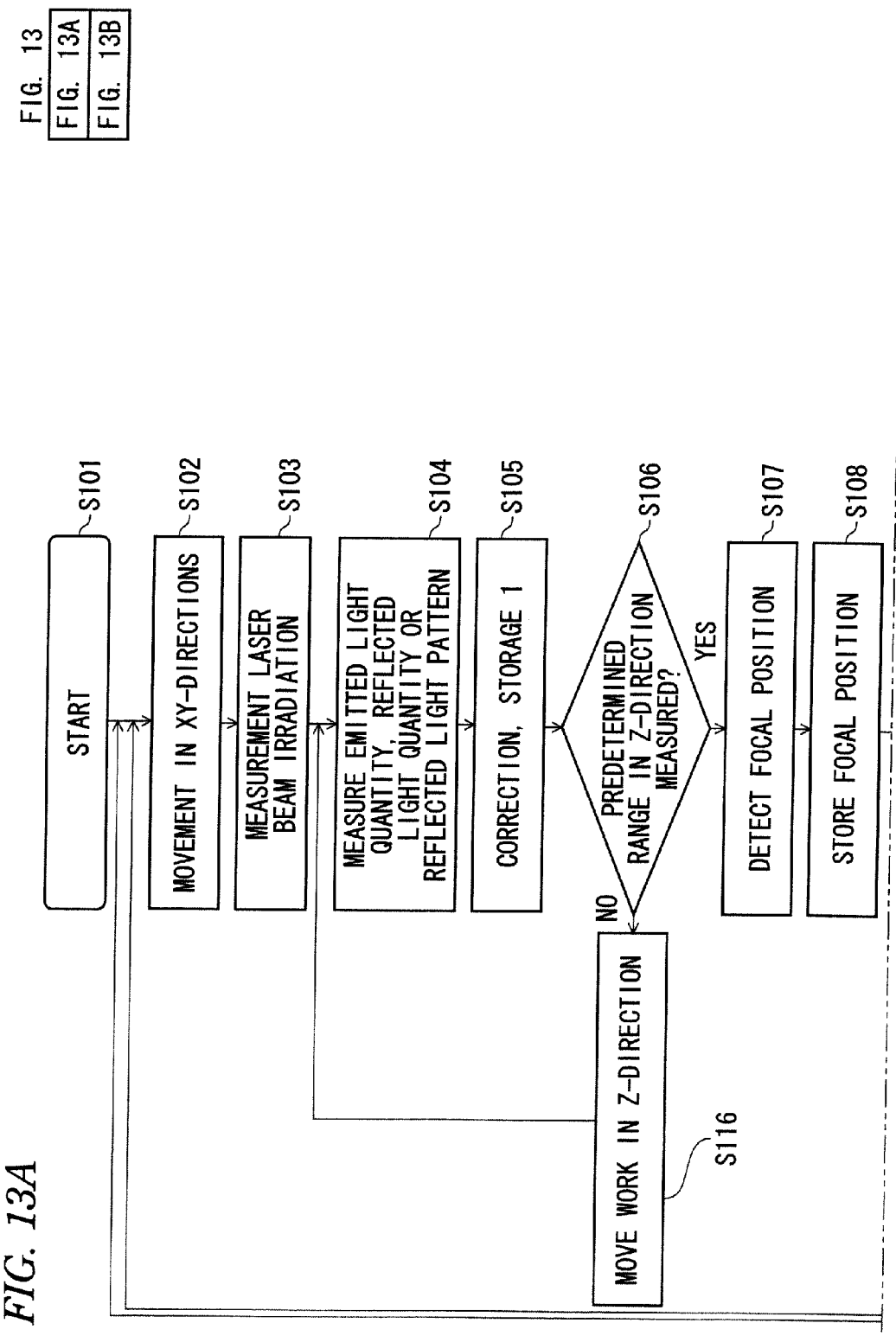

MOLD REMOVING METHOD

TECHNICAL FIELD

The present invention relates to a mold removing method for exposing an IC by measuring a thickness of a mold, such as an IC mold, with which a processed member is covered and removing the mold.

BACKGROUND ART

In general, failure analysis of an IC (Integrated Circuit) is being performed. The IC is fabricated by integrating a number of microminiature elements, such as a transistor, a diode, a resistor or a capacitor, on a substrate, and by electrically connecting or insulating the elements. In an IC package, a semiconductor chip is sealed with a mold, such as a resin. Hence, when a malfunction occurs in the integrated circuit formed on the semiconductor chip of the IC package, in order to conduct a cause analysis or to make a circuit modification, it is desired to remove the resin that seals the semiconductor chip so as to expose the semiconductor chip.

Therefore, conventionally, as a method for unsealing the IC package, the resin is removed by applying an acting medium, such as a nitric acid, with a jet flow on the resin mold that seals the semiconductor chip of the IC package. Also, dry etching or the like are used.

However, according to the conventional chemical solution method in which a solution is used to remove the resin mold so as to unseal the IC package, there is a problem of waste liquid treatment and corrosion of an apparatus. As for the dry etching, there is a problem that a processing speed is low. Further, because a position or an installed condition of the semiconductor chip sealed with the resin mold is unrecognized, there is a problem that, for example, the semiconductor chip is damaged in a removal process or the resin with which the semiconductor chip is covered cannot completely be removed cleanly.

DISCLOSURE OF THE INVENTION

The present invention provides a mold removing method capable of performing unsealing treatment at high speed without using a chemical solution.

The present invention provides a mold removing method capable of monitoring a residual thickness of a mold and removing, by a laser processing, a mold to the minimum thickness without damaging an IC.

According to a first aspect of the invention, a mold removing method includes placing an IC chip covered with a molded member at a position toward which a measurement laser beam is emitted, irradiating the molded member with the measurement laser beam to measure an emitted light quantity toward the molded member and a reflected light quantity from the molded member, measuring a thickness of the molded member using the reflected light quantity from the molded member, obtaining a corrected value by normalizing the reflected light quantity from the molded member using the emitted light quantity toward the molded member, and comparing the corrected value with a set value, which is preset in accordance with the thickness of the molded member, to obtain a removal quantity of a mold to be removed in terms of a heightwise position of the molded member, and changing a laser emission condition based on the removal quantity of the mold and removing the molded member by laser processing.

According to a second aspect of the invention, the mold removing method includes irradiating the molded member with, the measurement laser beam to measure the heightwise position of the molded member.

According to a third aspect of the invention, the mold removing method includes adjusting the heightwise position of the molded member.

According to a fourth aspect of the invention, a mold removing method includes placing an IC chip covered with a molded member at a position toward which a measurement laser beam is emitted, emitting the measurement laser beam to measure an emitted light quantity toward the molded member and a reflected light quantity from the molded member in each position of the molded member, calculating a corrected light quantity from the emitted light quantity and the reflected light quantity measured in the each position to measure a heightwise position of the molded member, adjusting a heightwise position of the molded member, obtaining a corrected value by normalizing the reflected light quantity from the molded member using the emitted light quantity toward the molded member, and comparing the corrected value with a set value, which is preset in accordance with a thickness of the molded member, to obtain a removal quantity of a mold to be removed in terms of the heightwise position of the molded member, and changing a laser emission condition based on the removal quantity of the mold and removing the molded member by laser processing.

According to a fifth aspect of the invention, in the mold removing method, the adjusting the heightwise position of the molded member includes creating an approximate curve from the corrected light quantity corresponding to the each position of the molded member and detecting a focal position such that the corrected light quantity becomes maximum in position relation to a position direction of the molded member.

Other features and advantages will be apparent from the description of examples and the appended claims.

BRIEF DESCRIPTION OF THE DRAWINGS

FIG. 9 is a diagram showing an IC as a work which is an object to be processed, in which FIG. 9(A) shows a cross-sectional condition of the work before laser processing, FIG. 9(B) shows a cross-sectional condition of the work during the laser processing, and FIG. 9(C) shows a cross-sectional condition of the work in which a plastic mold is taken off by the laser processing;

FIG. 13A is a first portion of a flowchart showing a second example of removing a mold using a laser processing apparatus.

DESCRIPTION OF REFERENCE NUMERALS AND SIGNS

1 Laser Processing Apparatus
2 Work (Processing Object)
3 Laser Light Source (Laser Beam Emitting Means)
4 First Light Receiving Element
(Emitted Light Characteristic Measuring Means, Emitted Light Quantity Measuring Means)
5 Second Light Receiving Element
(Part of Reflected Light Characteristic Measuring Means, Part of Reflected Light Quantity Measuring Means, Light Receiving Element)
6 Shielding Member
(Part of Reflected Light Characteristic Measuring Means, Part of Reflected Light Quantity Measuring Means)
6a Micro-Hole (Hole)
7 Imaging Element
(Reflected Light Characteristic Measuring Means, Reflected Light Quantity Measuring Means)
8 Optical System
9 Reflector
10 Moving Mechanism
11 Controller (Control Means)
14 Concave Lens
15 Convex Lens
16 Beam Expander
17 First Beam Sampler
18 Second Beam Sampler
19 Objective Lens
21 Holder
22 Driver
30 IC
31,60 IC. Chip
32 Wiring Member
33,62 Resin Mold
34 Upper Surface of IC
40 Galvano-Scanner
61 Cavity
63 Large Rough Processing Region by Laser
64 Middle Rough Processing Region by Laser
65 Small Rough Processing (Finish Processing) Region by Laser

BEST MODE FOR CARRYING OUT TUE INVENTION

Hereinafter, embodiments of the present invention will be described with reference to the drawings.

(General Configuration of Laser Processing Apparatus)

Figure 1:
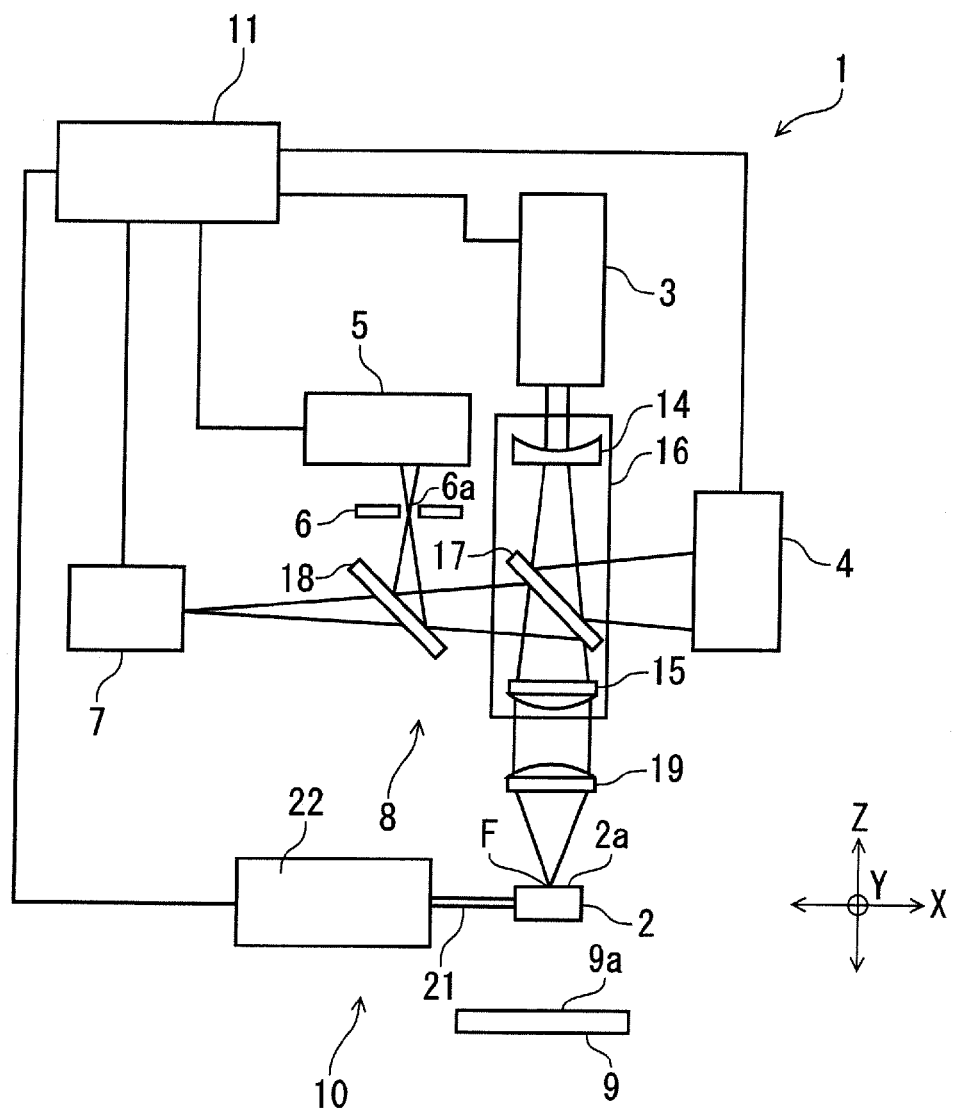
FIG. 1 is a diagram schematically showing a general configuration of a laser processing apparatus of an embodiment of the present invention.
Figure 2:
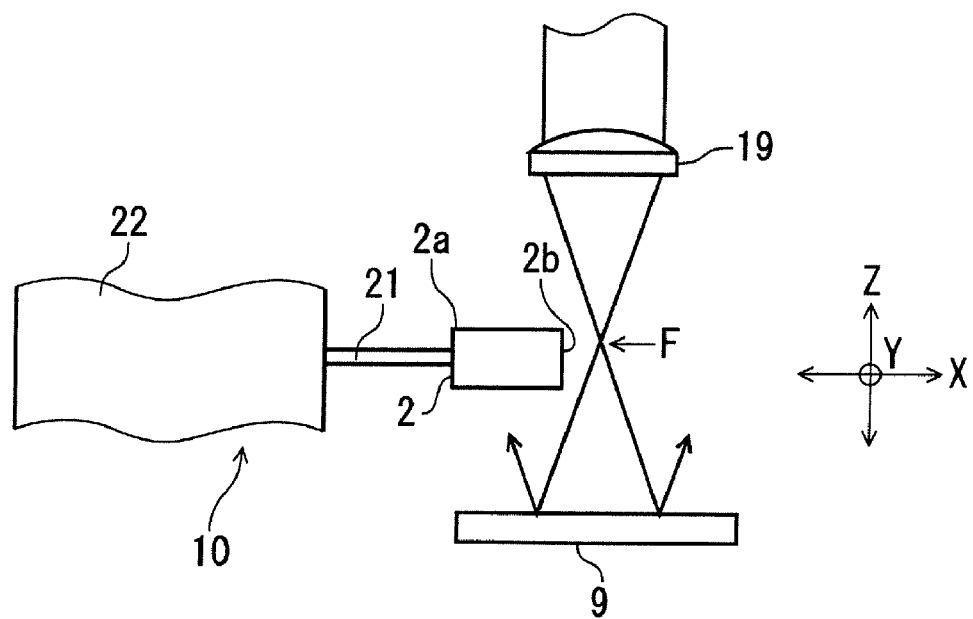
FIG. 2 is a diagram showing a state in which an IC chip shown in FIG. 1 is in a position shifted in an X-direction from a focal point of measurement laser beam.

FIG. 1 is a diagram schematically showing a general configuration of a laser processing apparatus 1 used in removal of a mold such as a resin. FIG. 2 is a diagram showing a state in which a work 2 shown in FIG. 1 is in a position shifted in an X-direction from a focal point F of measurement laser beam.

The laser processing apparatus 1 is a laser microprocessing apparatus for performing fine laser processing such as removal processing or bonding processing with respect to a certain processing object 2 (may hereinafter be called "work"). The laser processing apparatus 1 is a lightweight and compact processing apparatus capable of installation of a desktop. This laser processing apparatus 1 includes a laser light source 3, a first light receiving element 4, a second light receiving element 5, a shielding member 6, an imaging element 7 and an optical system 8 as shown in FIG. 1. The laser light source 3 is laser beam emitting means for emitting processing laser beam for processing the work 2 and measurement laser beam for, for example, aligning the work 2 with a focal point of the processing laser beam. The first light receiving element 4 is emitted light quantity measuring means for measuring an emitted light quantity of the measurement laser beam emitted from the laser light source 3. The second light receiving element 5 and the shielding member 6 are reflected light quantity measuring means for measuring a reflected light quantity of the measurement laser beam reflected by the work 2. In the imaging element 7, the work 2 is photographed using the reflected light of the measurement laser beam. In the optical system 8, an optical path of the measurement laser beam or the processing laser beam emitted from the laser light source 3 is formed.

Light sources of the processing laser beam and the measurement laser beam may respectively be set separate dedicated light sources, and these light sources may be arranged coaxially. In that case, the first light receiving element 4 as the emitted light quantity measuring means for measuring the emitted light quantity of the measurement laser beam may be omitted.

The laser processing apparatus 1 further includes a reflector 9 for reflecting the measurement laser beam, a moving mechanism 10 for movably holding the work 2 and a controller 11 for performing various control of the laser processing apparatus 1. The reflector 9 is arranged in a position away from the work 2 with respect to the laser light source 3 in an optical axis direction of the measurement laser beam and the processing laser beam.

Hereinafter, when collectively describing the processing laser beam and the measurement laser beam, it is described as "laser beam". Further, left and right directions, a paper surface vertical direction and up and down, directions (that is, the optical axis direction of the laser beam applied to the work 2) of FIG. 1 are hereinafter represented as an X-direction, a Y-direction and a Z-direction, respectively.

In this embodiment, the optical axis direction of the laser beam applied to the work 2 is set vertically to a processed surface, but the laser beam may be applied at an oblique angle.

The optical system 8 includes a beam expander 16, a first beam sampler 17, a second beam sampler 18 and an objective lens 19. The beam expander 16 has a concave lens 14 and a convex lens 15. The first beam sampler 17 is arranged between the concave lens 14 and the convex lens 15. The second beam sampler 18 is arranged between the imaging element 7 and the first beam sampler 17. The objective lens 19 is arranged between the beam expander 16 and an arrangement position of the work 2.

In the beam expander 16, the concave lens 14 is arranged in the side of the laser light source 3 and the convex lens 15 is arranged in the side of the objective lens 19. This beam expander 16 expands a diameter of the laser beam emitted from the laser light source 3. The first beam sampler 17 transmits most of the laser beam emitted from the laser light source and passing through the concave lens 14 toward the convex lens 15 and also reflects a part of the laser beam toward the first light receiving element 4. Also, the first beam sampler 17 reflects a part of the measurement laser beam reflected by the reflector 9 or the work 2 toward the imaging element 7. The second beam sampler 18 reflects a part of the measurement laser beam toward the imaging element 7 and reflected by the first beam sampler 17 toward the second light receiving element 5. The objective lens 19 collects the laser beam passing through the convex lens 15 to the work 2.

The laser light source 3 is, for example, a fiber laser, and outputs the processing laser beam and the measurement laser beam as described above. An output of the measurement laser beam becomes very smaller than an output of the processing laser beam. For example, the output of the measurement laser beam is about one-twentieth the output of the processing laser beam. Also, the laser light source 3 of the embodiment emits the processing laser beam with a stable output in order to perform proper processing of the work 2. On the other hand, due to characteristics of the laser light source 3, the output from the laser light source 3 of the measurement laser beam with an output very smaller than that of the processing laser beam is not stable. That is, the output of the measurement laser beam emitted from the laser light source 3 varies with time. Also, in the embodiment, a wavelength of the processing laser beam becomes substantially equal to a wavelength of the measurement laser beam and a focal position of the processing laser beam substantially coincides with a focal position of the measurement laser beam. In addition, when the light sources of the processing laser beam and the measurement laser beam are respectively set in separate dedicated light sources, the output of the measurement laser beam becomes stable.

The first light receiving element 4 and the second light receiving element 5 are constructed of an element such as a photodiode or a phototransistor. The first light receiving element 4 measures an emitted light quantity of the measurement laser beam emitted from the laser light source 3 by converting the received light quantity into an electric quantity. Also, the second light receiving element 5 measures a reflected light quantity of the measurement laser beam reflected by the work 2 by converting the received light quantity into an electric quantity.

A micro-hole (pinhole) 6a as a hole through which the measurement laser beam reflected by the second beam sampler 18 passes is formed in the shielding member 6. In the embodiment, the shielding member 6 is arranged so that a position (focusing position) in which the reflected light of the work 2 forms an image becomes a position of formation of the micro-hole 6a when the work 2 (more specifically, for example, an upper surface 2a of the work 2 in FIG. 1) is in a position of the focal point F of the measurement laser beam. That is, the second light receiving element 5 of the embodiment measures the reflected light quantity of the measurement laser beam reflected by the work 2 using a confocal effect of removing out-of-focus extra reflected light with a difficult-to-stabilize output.

The imaging element 7 is an image sensor such as a CMOS or a CCD. This imaging element 7 is arranged so that the reflected light of the work 2 forms the image becomes a received light surface of the imaging element 7 when the work 2 is in the position of the focal point F of the measurement laser beam.

The reflector 9 reflects the measurement laser beam when the work 2 is in a position deviating from the focal point F of the measurement laser beam in a direction orthogonal to the Z-direction as shown in FIG. 2. This reflector 9 is used for detecting the ends of the X and Y-directions (the direction orthogonal to the Z-direction) of the work 2 as described below. The reflector 9 of the embodiment is formed by a ceramic member or a metal member. Also, a reflecting surface (an upper surface of FIG. 1) 9a of the reflector 9 is formed in a diffusely reflecting surface (a rough surface) for diffusely reflecting the incident measurement laser beam. That is, the reflecting surface 9a is roughened. In addition, the reflecting surface 9a may be a mirror surface.

The moving mechanism 10 includes a holder 21 for holding the work 2 and a driver 22 for driving the holder 21. The driver 22 drives the holder 21 in triaxial directions of the X, Y and Z-directions.

The laser light source 3, the first light receiving element 4, the second light receiving element 5, the imaging element 7 and the moving mechanism 10 are connected to the controller 11. The controller 11 performs various control of the laser processing apparatus 1. For example, the controller 11 outputs an emission command or a stop command of laser beam to the laser light source 3. Also, based on the emitted light quantity measured by the first light receiving element 4 and the reflected light quantity measured by the second light receiving element 5 (based on the reflected light quantity measured by the second light receiving element 5 when a dedicated laser light source for measurement is disposed), the controller 11 specifies a Z-direction position of the focal point F of the measurement laser beam and moves the moving mechanism 10 and moves the work 2 to the position of the focal point F as described below. Also, the controller 11 includes processing state detecting means for detecting a processing state of the processing object based on a change in the reflected light quantity, and performs control of a stop command etc, of the laser beam according to the processing state.

(Mechanism of Detecting Z-direction position of Focal Point of Measurement Laser Beam)

Figure 3:
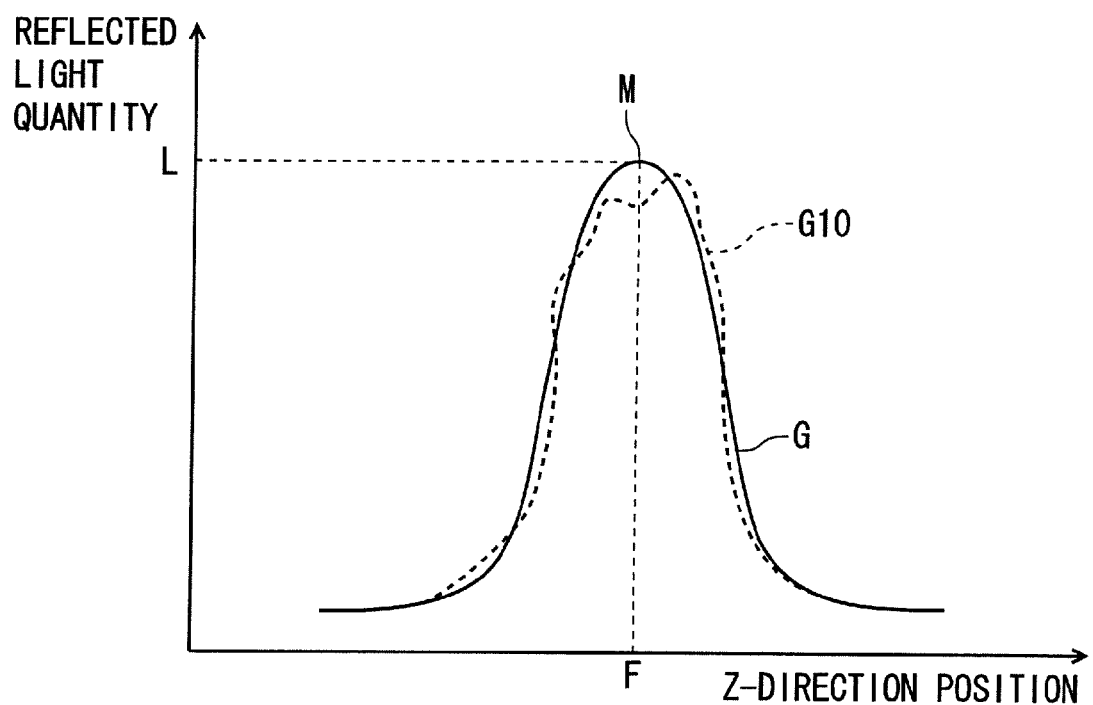
FIG. 3 is a graph showing a relation between a position of the IC chip shown in FIG. 1 in a Z-direction and a reflected light quantity measured by a second light receiving element.

FIG. 3 is a graph showing a relation between the position of the work 2 shown in FIG. 1 in the Z-direction and the reflected light quantity measured by the second light receiving element 5.

In the embodiment, the Z-direction position of the focal point F of the measurement laser beam is detected based on the emitted light quantity of the measurement laser beam measured by the first light receiving element 4 and the reflected light quantity of the measurement laser beam measured by the second light receiving element 5. A mechanism of detecting the Z-direction position of the focal point of the measurement laser beam of the embodiment will hereinafter be described.

When an output of the measurement laser beam emitted from the laser light source 3 is constant, a relation between the Z-direction position of the work 2 and the reflected light quantity of the measurement laser beam measured by the second light receiving element 5 becomes substantially a normal distribution shape like the graph shown by line G of FIG. 3. That is, when the work 2 is in a position of the focal point F of the measurement laser beam in the Z-direction, the reflected light quantity measured by the second light receiving element 5 becomes a maximum value L and as the work 2 moves away from the focal point F toward the side of the objective lens 19 or the side of the reflector 9, the reflected light quantity measured by the second light receiving element 5 becomes smaller.

Therefore, when the output of the measurement laser beam is constant, while moving the work 2 in the Z-direction by the moving mechanism 10, the reflected light quantity of the measurement laser beam is measured by the second light receiving element 5 and a maximum point M is specified and the Z-direction position of the work 2 corresponding to the maximum point M is measured and thereby, the Z-direction position of the focal point F of the measurement laser beam is detected.

However, as described above, the output of the measurement laser beam emitted from the laser light source 3 of the embodiment is not stable and varies with time. As a result of that, the relation between the Z-direction position of the work 2 and the reflected light quantity measured by the second light receiving element 5 does not become substantially the normal distribution shape, and varies like the graph shown by, for example, line G10 of FIG. 3. Therefore, when the Z-direction position of the focal point F of the measurement laser beam is detected using the reflected light quantity measured by the second light receiving element 5 as it is, detection accuracy of the Z-direction position of the focal point F of the measurement laser beam reduces.

Hence, in the embodiment, a corrected light quantity in which the reflected light quantity measured by the second light receiving element 5 is corrected is calculated based on the emitted light quantity of the measurement laser beam measured by the first light receiving element 4. That is, the present output of the measurement laser beam is grasped by the first light receiving element 4 and the corrected light quantity in which variations in the output are canceled is calculated from the reflected light quantity measured by the second light receiving element 5. Then, the Z-direction position of the focal point F of the measurement laser beam is detected based on this corrected light quantity.

More specifically, a relation between the emitted light quantity measured by the first light receiving element 4 and the output of the measurement laser beam (characteristics of the first light receiving element 4) and a relation between the reflected light quantity measured by the second light receiving element 5 and the output of the measurement laser beam (characteristics of the second light receiving element 5) are obtained in advance, and the corrected light quantity in which the variations in the output of the measurement laser beam are canceled is calculated from these relations. For example, when the characteristics of the first light receiving element 4 are equal to the characteristics of the second light receiving element 5, the corrected light quantity is calculated as described below.

(Corrected light quantity)=(reflected light quantity in second light receiving element 5)/(emitted light quantity in first light receiving element 4)

Then, by a relation to the Z-direction position of the work 2, a point at which this corrected light quantity becomes maximum is specified and the Z-direction position of the work 2 corresponding to its maximum point is measured and thereby, the Z-direction position of the focal point F of the measurement laser beam is detected.

In the embodiment, the corrected light quantity is calculated by the controller 11. That is, the controller 11 corrects the reflected light quantity measured by the second light receiving element 5 based on the emitted light quantity measured by the first light receiving element 4, and forms light quantity correcting means for calculating the corrected light quantity. Also, the position of the focal point F of the measurement laser beam is detected by the controller 11.

When the light sources of the processing laser beam and the measurement laser beam are respectively set in separate dedicated light sources, the output of the measurement laser beam becomes stable, so that it is unnecessary to correct the reflected light quantity measured by the second light receiving element 5 based on the emitted light quantity of the measurement laser beam.

(Mechanism of Detecting X and Y-Direction Ends of Work)

Figure 4:
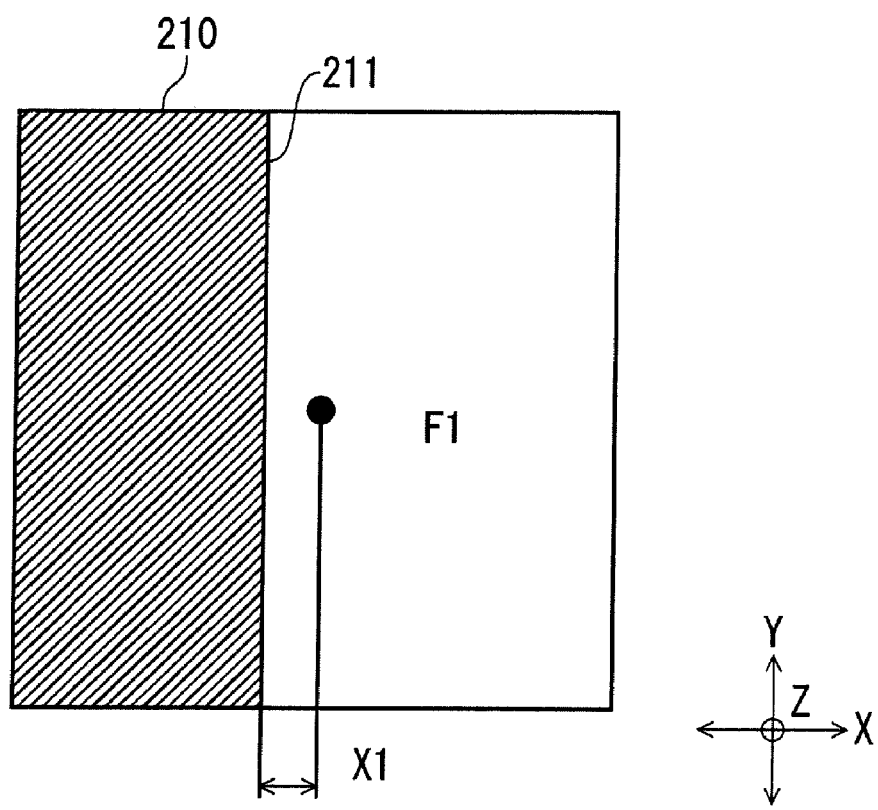
FIG. 4 is a diagram showing an example of an image captured by an imaging element at the time when the measurement laser beam is reflected by a reflector shown in FIG. 1.

FIG. 4 is a diagram showing an example of an image captured by the imaging element 7 at the time when the measurement laser beam is reflected by the reflector 9 shown in FIG. 1.

In the embodiment, ends of the work 2 in the X and Y-directions are detected using the measurement laser beam reflected by the reflector 9. A mechanism of detecting the ends of the work 2 in the X and Y-directions of the embodiment will hereinafter be described by taking the case of detecting the end 2b (see FIG. 2) of the X-direction of the work 2 with a rectangular parallelepiped shape as an example.

Before the X-direction end 2b of the work 2 is detected, the Z-direction position of the focal point F of the measurement laser beam is first detected by the method described above and the work 2 is aligned with the focal point F. That is, the upper surface 2a of the work 2 is aligned with the focal point F in the Z-direction as shown in FIG. 1. A focal corresponding point F1 corresponding to the focal point F is set on the image captured by the imaging element 7 in this state (see FIG. 4). Thereafter, as shown in FIG. 2, the work 2 is moved in the X-direction by the moving mechanism 10 and is arranged in a position deviating from the focal point F in the X-direction.

When the work 2 is shifted from the focal point F in the X-direction, for example, the image shown in FIG. 4 is captured by the imaging element 7. That is, a part of the measurement laser beam diffusely reflected by the reflector 9 is blocked by the work 2, a work corresponding area 210 corresponding to the work 2 on the image captured by the imaging element 7 becomes dark and the other area becomes bright. Also, the upper surface 2a of the work 2 is aligned with the focal point F in the Z-direction, so that an end corresponding line 211 corresponding to the X-direction end 2b of the work 2 is clearly specified on the image captured by the imaging element 7. That is, the X-direction end 2b of the work 2 is detected.

When the end corresponding line 211 is clearly specified, an X-direction distance X1 between the end corresponding line 211 and the focal corresponding point F1 is calculated. That is, a distance between the focal point F and the end 2b of the X-direction is calculated. Also, a distance between a processing site of the work 2 and the end 2b of the X-direction is previously known in design, so that an X-direction distance from the focal point F to the processing site of the work 2 is calculated. Similarly, the end of the Y-direction of the work 2 is detected and a Y-direction distance from the focal point F to the processing site of the work 2 is calculated. Also, the distance from the focal point F to the processing site of the work 2 is calculated by the controller 11. In addition, it is necessary to adjust an inclination of the reflecting surface 9a so that the end corresponding line 211 appears on the image captured by the imaging element 7 when the reflecting surface 9a of the reflector 9 is a mirror surface.

(Other Laser Processing Apparatuses)

In the embodiment described above, the reflected light quantity of the measurement laser beam reflected by the work 2 is measured by the second light receiving element 5, but the reflected light quantity of the measurement laser beam may be measured by the imaging element 7.

Figure 5:
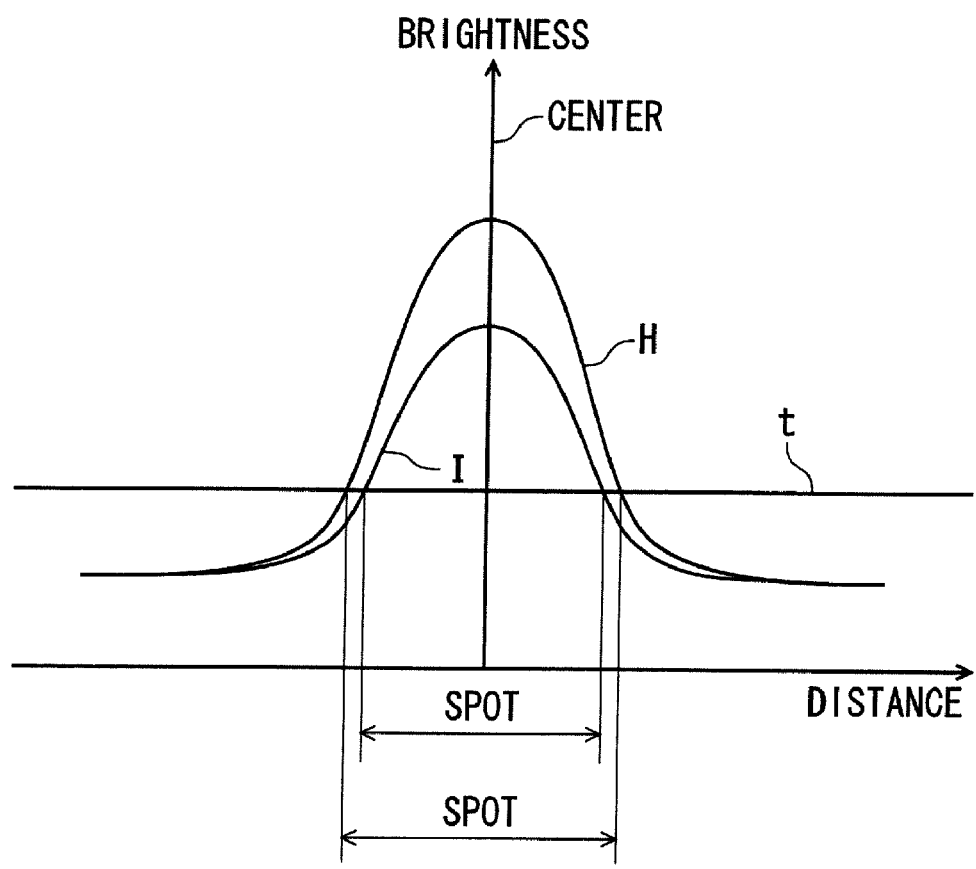
FIG. 5 is a graph showing a relation between brightness of light reflected by the IC chip shown in FIG. 1 and a distance from the center of the reflected light.

Also, the reflected light quantity of the measurement laser beam may be measured by both of the second light receiving element 5 and the imaging element 7. Here, reflected light incident on the imaging element 7 becomes brightest in the center of the reflected light and becomes dark gradually with distance from the center as shown by line H of FIG. 5. Then, in the image of the reflected light captured by the imaging element 7, a region having brightness with a predetermined threshold value t or more is specified as a spot of the reflected light and the total sum of brightness of the specified spot becomes the reflected light quantity of the measurement laser beam measured by the imaging element 7. Also, like the case of measuring the reflected light quantity by the second light receiving element 5, while moving the work 2 in the Z-direction by the moving mechanism 10, the reflected light quantity of the measurement laser beam is measured by the imaging element 7 and a maximum point of the reflected light quantity is specified by a relation to the Z-direction position of the work 2 and thereby, the Z-direction position of the focal point F of the measurement laser beam can be detected.

Figure 6:
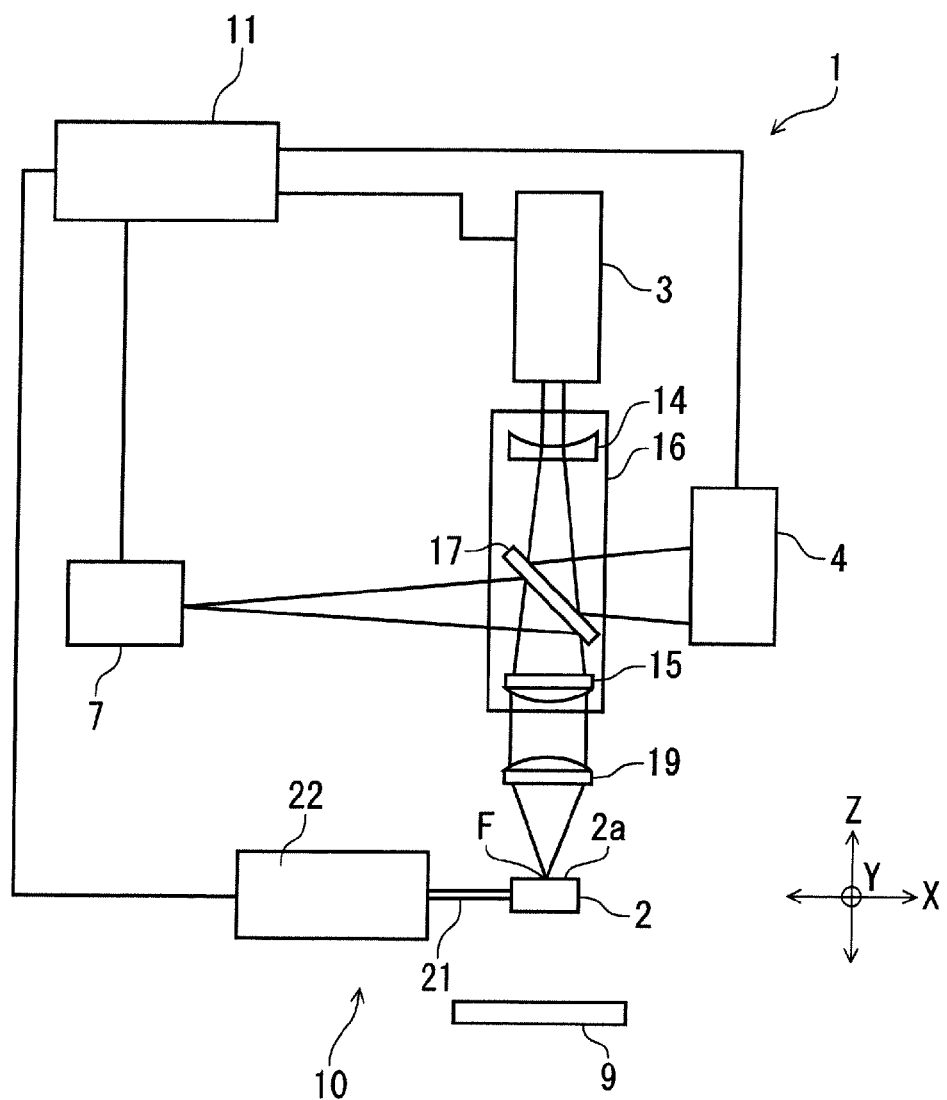
FIG. 6 is a diagram schematically showing a general configuration of another laser processing apparatus.

Also in this case, the reflected light quantity measured by the imaging element 7 varies even when the position of the Z-direction of the work 2 is constant when the output of the measurement laser beam varies with time. For example, when the output of the measurement laser beam reduces as shown by line I of FIG. 5, brightness of the reflected light incident on the imaging element 7 also reduces and the spot becomes small, with the result that the measured reflected light quantity also reduces. As a result of that, the Z-direction position of the focal point F of the measurement laser beam can be detected with high accuracy by correcting the reflected light quantity measured by the imaging element 7 in consideration of variations in the emitted light quantity from the measured result in the first light receiving element 4 like the embodiment described above. In addition, when the reflected light quantity is measured by only the imaging element 7, the need for the second light receiving element 5, the shielding member 6 and the second beam sampler 18 is eliminated as shown in FIG. 6, so that the configuration of the laser processing apparatus 1 can be simplified. Also, when the reflected light quantity is measured by only the second light receiving element 5, the imaging element 7 may be omitted.

Figure 7:
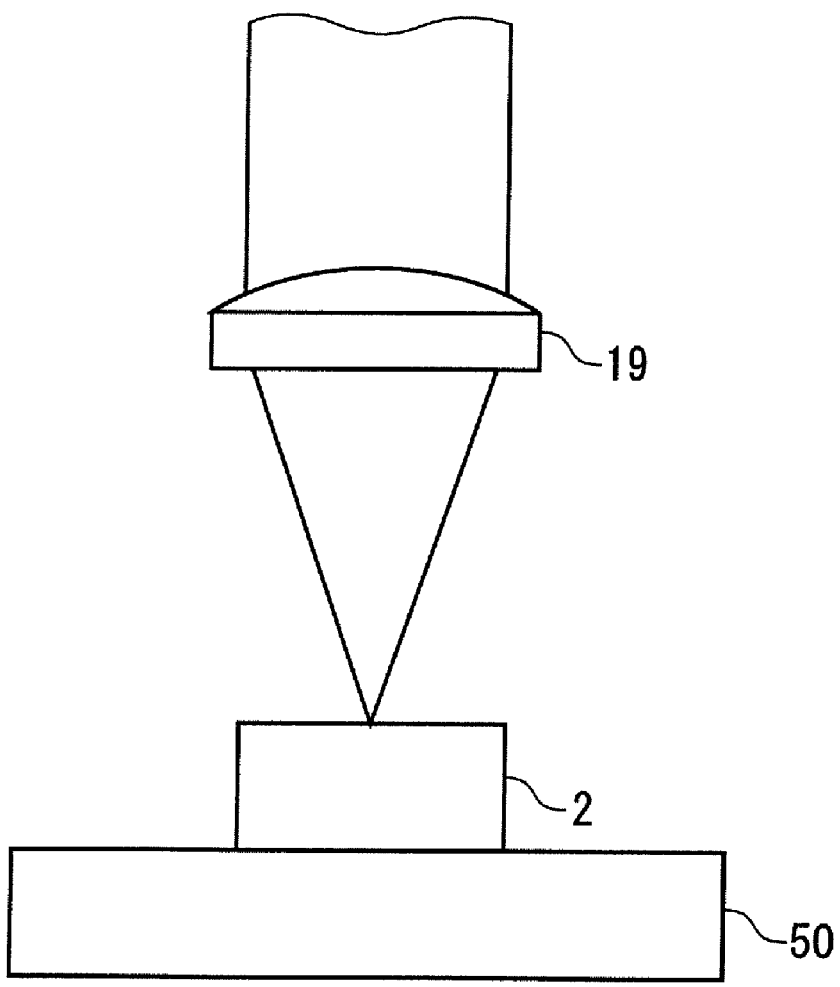
FIG. 7 is a diagram schematically showing a general configuration of a moving mechanism according to another embodiment of the present invention.

In the embodiment described above, the laser processing apparatus 1 includes the reflector 9, but the work 2 may be placed on a moving mechanism 50 without disposing the reflector 9 as shown in FIG. 7. In this case, the X and Y-direction ends of the work 2 could be detected as follows. That is, as shown in FIG. 7, the work 2 is first arranged in a position of the focal point F of the measurement laser beam in the X, Y and Z-directions and a reference reflected light quantity at the time of emitting the measurement laser beam from the laser light source 3 by a predetermined reference output is measured by the second light receiving element 5 or the imaging element 7. Then, it is decided that the end of the X-direction or the Y-direction of the work 2 is detected when the reflected light quantity measured by the second light receiving element 5 or the imaging element 7 reaches a certain ratio (for example, 50% of the reference reflected light quantity) to the reference reflected light quantity while moving the work 2 in the X-direction or the Y-direction. Also in this case, the reflected light quantity measured by the second light receiving element 5 or the imaging element 7 varies even when the position of the work 2 is constant when the output of the measurement laser beam emitted from the laser light source 3 varies with time, but the end of the X or Y-direction of the work 2 can be detected with high accuracy by correcting the reflected light quantity in consideration of variations in the emitted light quantity from the measured result in the first light receiving element 4. As a result of that, a focal position of the processing laser beam can be aligned with a processing site of the work 2 in the X or Y-direction with high accuracy.

In the embodiment described above, while moving the work 2 in the Z-direction by the moving mechanism 10, the corrected light quantity is calculated and the position of the focal point F is detected and also the work 2 is aligned. In addition to this for example, the work 2 is moved in the Z-direction in a state of emitting the measurement laser beam from the laser light source 3 by the predetermined reference output and a relation between the reflected light quantity and the Z-direction position of the work 2 is previously grasped and also the work 2 may be aligned with the focal point F from the reflected light quantity measured by the second light receiving element 5 or the imaging element 7 based on this grasped relation. In this case, the Z-direction position of the work 2 can also be detected from the reflected light quantity based on the previously grasped relation.

In the embodiment described above, the emitted light quantity of the measurement laser beam is measured by the first light receiving element 4 and the reflected light quantity of the measurement laser beam is measured by the second light receiving element 5. Also, the corrected light quantity in which variations in the output of the measurement laser beam are canceled is calculated based on the measured emitted light quantity. In addition to this, for example, instead of the emitted light quantity, other characteristics capable of detecting variations in the output of the measurement laser beam of a size of the spot formed through a predetermined optical system, intensity or the output of the measurement laser beam are measured and the corrected light quantity in which the variations in the output of the measurement laser beam are canceled may be calculated based on these characteristics. Also, the position of the focal point F of the measurement laser beam is detected from a size of the spot detected by the imaging element 7 and also the size of the spot detected by the imaging element 7 may be corrected based on characteristics of the measurement laser beam emitted from the laser light source 3.

When the output of the processing laser beam is very large and the first light receiving element 4 may be destroyed by the processing laser beam reflected by the first beam sampler 17, or the second light receiving element 5 or the imaging element 7 may be destroyed by the processing laser beam reflected by the work 2 etc., it is preferable to arrange a shutter, a film for light extinction or a beam sampler for the purpose of light extinction between the first beam sampler 17 and the first light receiving element 4 or between the first beam sampler 17 and the second beam sampler 18.

Figure 8:
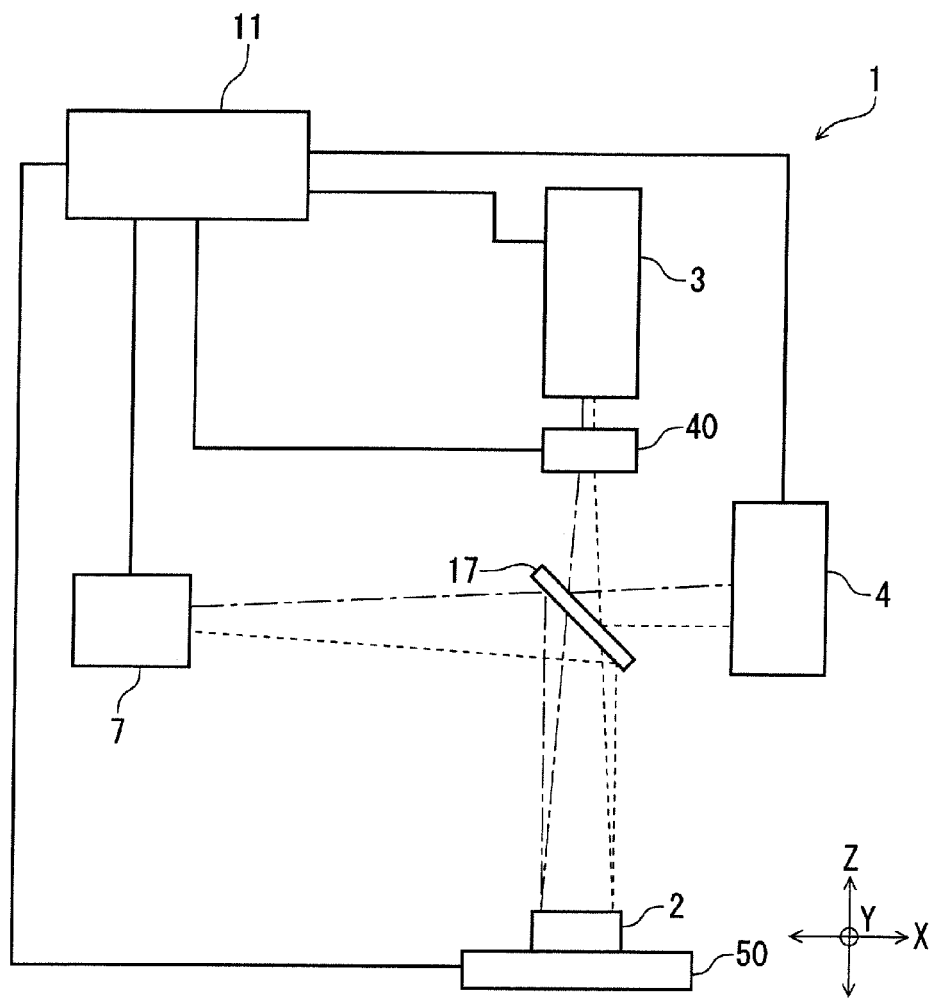
FIG. 8 is a diagram schematically showing a general configuration of a laser processing apparatus according to yet another embodiment of the present invention.

FIG. 8 is a diagram showing a laser processing apparatus using a galvano-scanner 40 in scanning of laser beam in X and Y-directions and using a moving mechanism 50 capable of moving in a Z-direction in combination.

EXAMPLE 1

A resin mold removing method for exposing a semiconductor chip by removing a resin mold with which the semiconductor chip of the inside of a package is covered using the laser processing apparatus described above will hereinafter be described.

FIG. 9 shows, for example, an IC as work which is a processing object, and FIG. 9(A) shows a cross-sectional condition of the work before laser processing, and FIG. 9(B) shows a cross-sectional condition of the work during the laser processing, and FIG. 9(C) shows a cross-sectional condition of the work in which a plastic mold is unsealed by the laser processing. The IC is constructed of an IC chip such as a transistor, a diode, a resistor or a capacitor, a wiring member for electrically connecting the IC chips mutually, and a resin mold with which the IC chip is covered. In addition, the work which is the processing object of the invention is not limited to the IC chip, and may also be applied to, for example, a composite material into which a bulk material such as a ceramic is mixed. The IC chip has a reflectance higher than that of a resin member.

As shown in FIG. 9(A), an IC 30 is constructed of an IC chip 31 such as a transistor, a diode, a resistor or a capacitor, a wiring member 32 for electrically connecting the IC chips mutually, and a plastic mold 33 with which the IC chip 31 is covered. A YAG laser (a wavelength of 1064 nm) and a CO2 laser (a wavelength of 10.64 μm) are greatly used in model number marking etc. since the lasers are absorbed into a resin material for substrate or a molding material of the IC.

Figure 10:
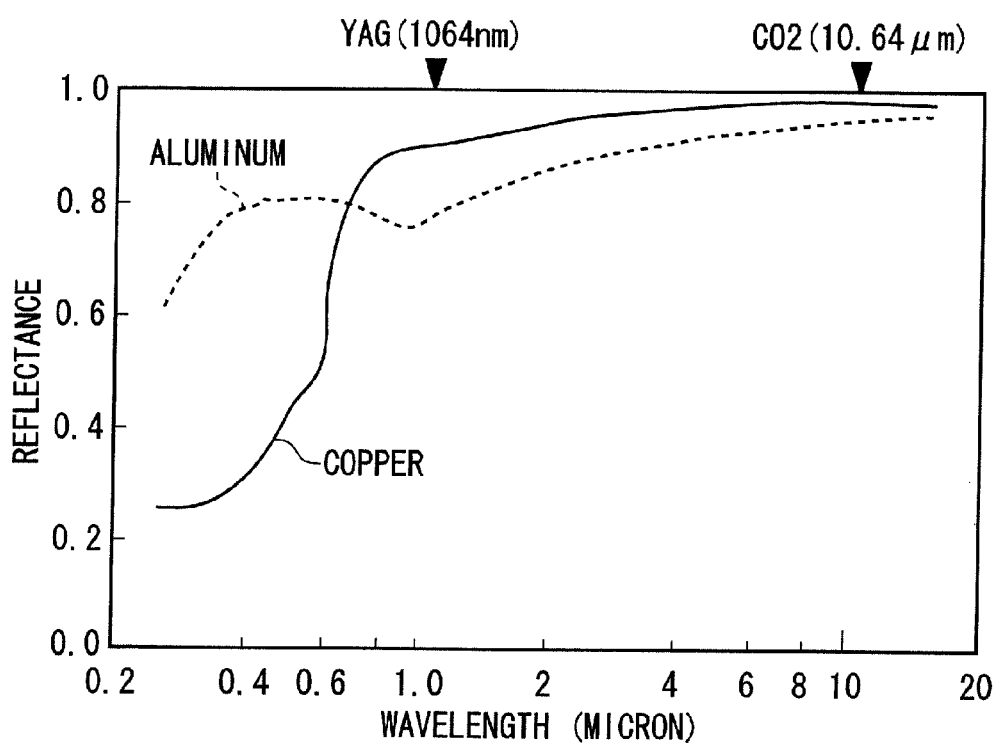
FIG. 10 is a graph showing reflectances of copper and aluminum with respect to a YAG laser and a $CO_2$ laser.

On the other hand, when reflectances of copper and aluminum which are wiring materials are shown in FIG. 10, both of copper and aluminum have the reflectance of 80% or more in the YAG laser and have the very high reflectance of 95% or more in the CO2 laser. Also, the IC chip 31 made of silicon etc. reflects the laser beam more than the molding material.

The work which is the processing object of the invention is not limited to the resin mold, and may also be applied to, for example, the composite material into which the bulk material such as the ceramic is mixed.

Now, when laser processing is performed from an upper surface 34 of the IC 30 in the case of unsealing the IC 30 shown in FIG. 9(A) from the upper portion of the IC chip 31 for failure analysis, the plastic mold 33 is gradually removed and a coating of the plastic mold 33 becomes thin to a state in which the IC chip 31 is exposed or is nearly exposed as shown in FIGS. 9(B) and 9(C).

When the thickness of the plastic mold 33 is large as shown in FIG. 9, applied measurement laser beam is absorbed into the plastic mold 33, and reflected and scattered light with a relatively small light quantity is generated. When the processing proceeds, the laser passing through the plastic mold 33 is reflected and scattered by a surface of the chip 31 in addition to the reflected and scattered light from the plastic mold 33. Consequently, a measured light quantity received by a second light receiving element increases. When the plastic mold 33 is eliminated, only the reflected and scattered light on the surface of the chip 31 with a relatively high reflectance is measured, so that the measured light quantity is maximized. A processing state can be grasped by monitoring a change in this measured light quantity by the processing state detecting means of the controller 11.

Figure 11:
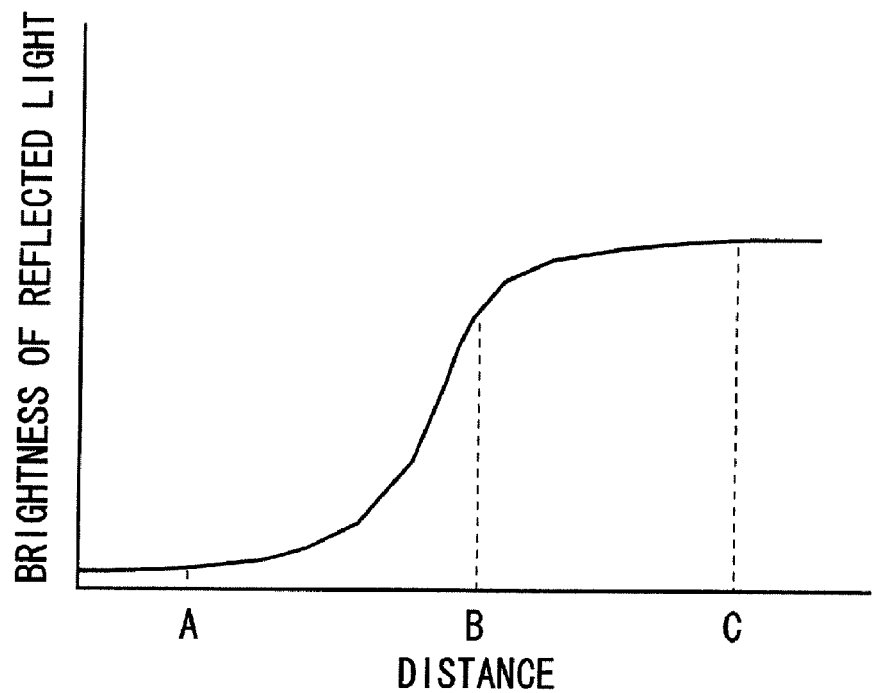
FIG. 11 is a graph showing a reflected light quantity of measurement laser beam in respective conditions of FIGS. 9(A), 9(B) and 9(C)

When the plastic mold 33 is completely removed as shown in FIG. 9(C), the laser processing is performed until a reflected light quantity shown by a value C of FIG. 11 is reached, and also when a part of the plastic mold is left as shown in FIG. 9(B), the laser processing is performed until the reflected light quantity shown by a value B of FIG. 11 is reached. The mold is not limited to a resin, and may be a ceramic.

Figure 12A:
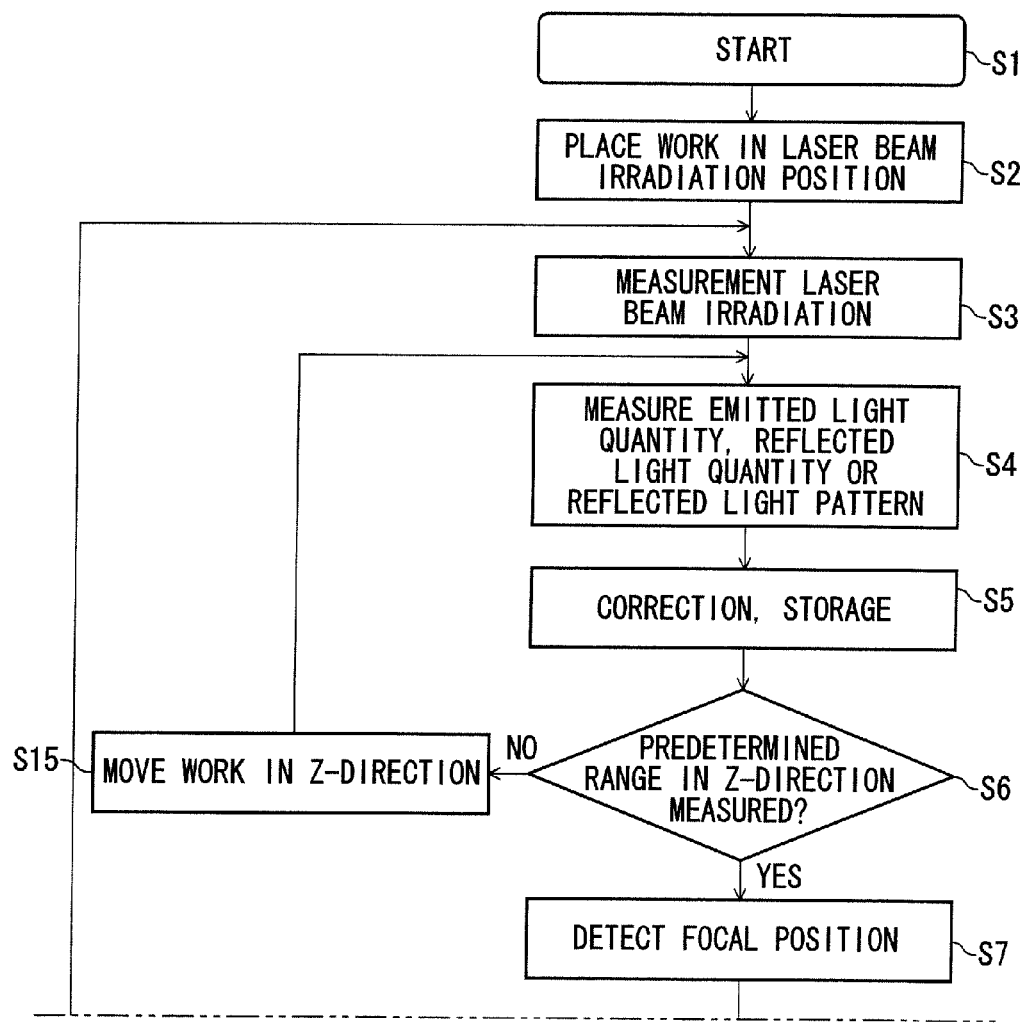
FIG. 12A is a first portion of a flowchart showing a first example of removing a mold using a laser.
Figure 12B:
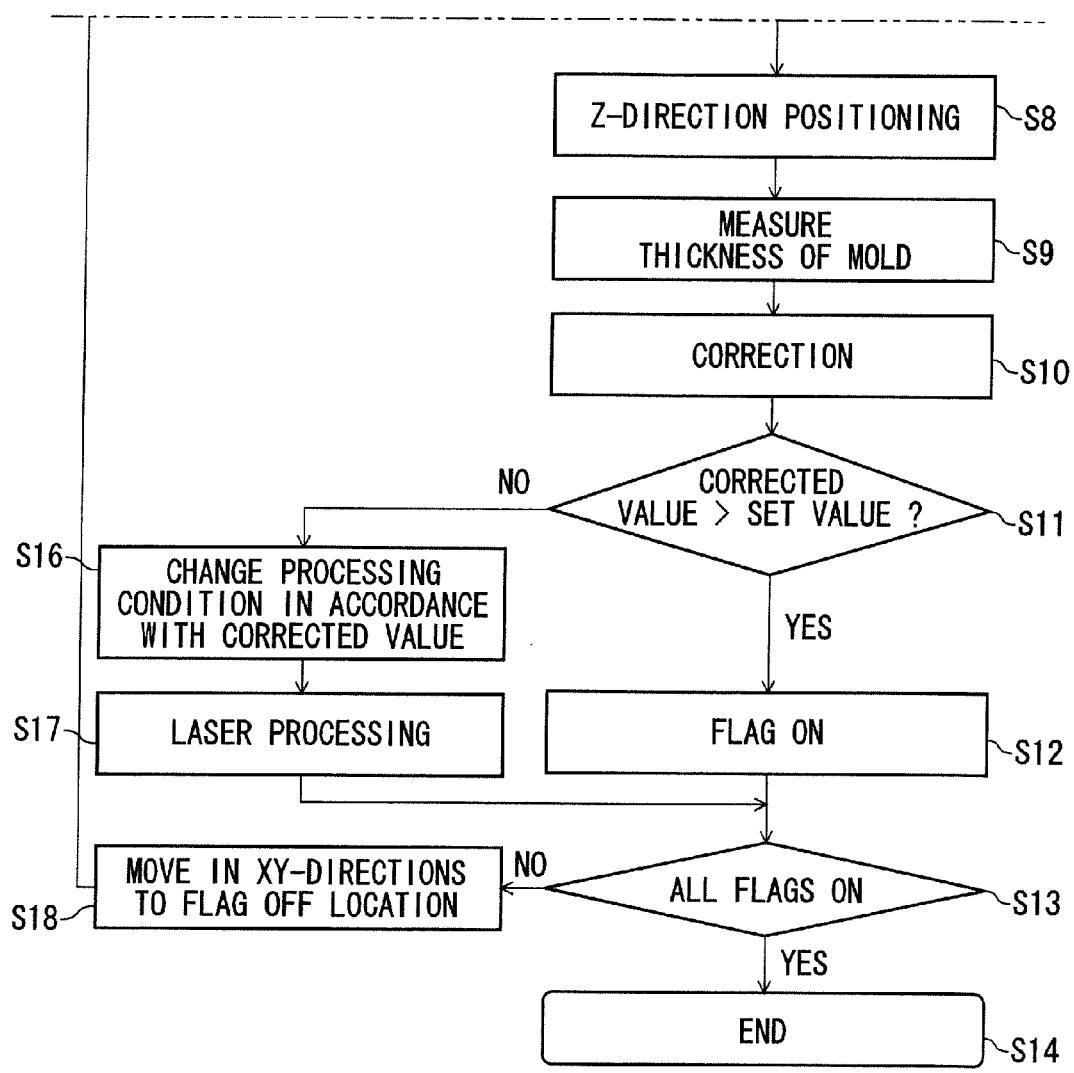
FIG. 12B is a second portion of the same flow chart.

FIG. 12 is a flowchart showing a first example showing a method for removing a resin mold. First, in step 2, work is moved in X and Y-directions by a moving mechanism and the work is arranged in a position in which laser beam emitted from a laser light source is applied. Next, in step 3, measurement laser beam is emitted from the laser light source and in step 4, an emitted light quantity, a reflected light quantity or a reflected light pattern is measured by a light receiving element. In step 5, a corrected light quantity is calculated and stored from the emitted light quantity and the reflected light quantity. Then, in step 6, the work is arranged in a predetermined range including a focal position of the measurement laser beam in a Z-direction and it is decided whether or not the emitted light quantity and the reflected light quantity are measured in each arrangement position within the predetermined range. When measurement is not made in the predetermined range, the work is arranged in a predetermined range of the Z-direction in step 15 and the flowchart returns to step 4 of measurement. When the measurement is made in the predetermined range, in step 7, an approximate curve is created from the corrected light quantity corresponding to each position of the work and a point at which the corrected light quantity becomes maximum by a relation to a Z-direction position of the work is specified and the Z-direction position of a focal point F is detected. The Z-direction position of the focal point of the measurement laser beam at this time represents a height of the work in the X and Y-directions. Then, in step 8, the work is moved from the focal position measured result to a focal distance suitable for mold thickness measurement or the height of the work. In step 9, in order to monitor the residual thickness of the mold, the measurement laser beam is emitted from the laser light source and the emitted light quantity, the reflected light quantity, the reflected light pattern, etc. are measured. In step 10, using the emitted light quantity measured, the reflected light quantity is normalized and is set as a corrected value. Then, in step 11, the corrected value is compared with a set value set according to the residual mold thickness (for example, the reflected light quantity of point B or C of FIG. 11 is set at the set value). When the corrected value is larger than the set value, a flag indicating the completion of processing is turned on. When the corrected value is smaller than the set value, a processing condition is changed according to the corrected value in step 16 and laser processing is performed in step 17. It is checked whether all the flags are turned on in step 13, and when all the flags are turned on, the flowchart ends in step 14. When all the flags are not turned on, the work is moved to a place in which the flag is turned off in step 18 and the flowchart returns to step 3.

EXAMPLE 2

Figure 13B:
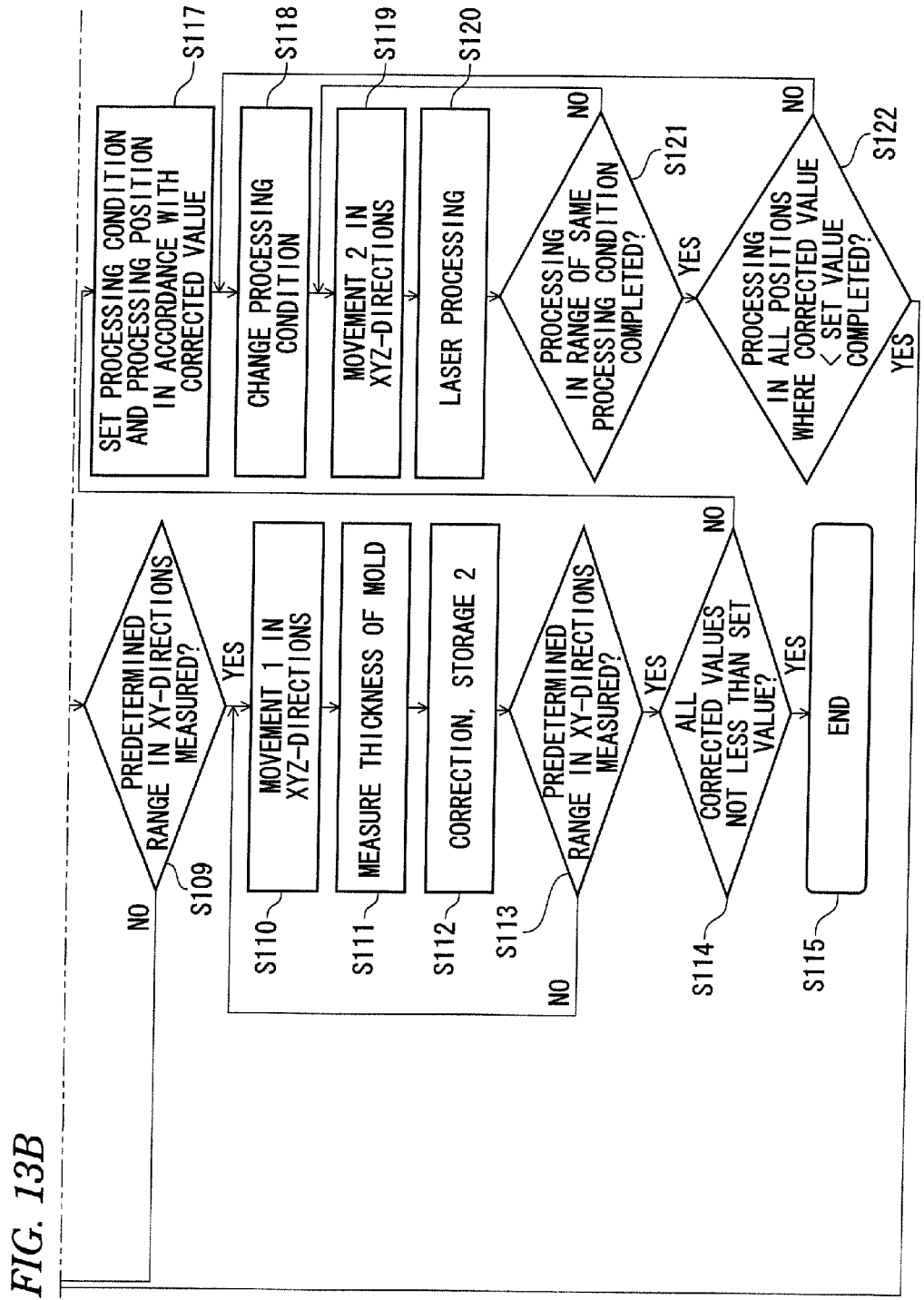
FIG. 13B is a second portion of the same flowchart.

FIG. 13 is a flowchart showing a second example showing a method for removing a resin mold.

First, in step 102, work is moved in X and Y-directions by a moving mechanism and the work is arranged in a position in which laser beam emitted from a laser light source is applied. Next, in step 103, measurement laser beam is emitted from the laser light source and in step 104, an emitted light quantity, a reflected light quantity or a reflected light pattern is measured by a light receiving element. In step 105, a corrected light quantity is calculated and stored from the emitted light quantity and the reflected light quantity. Then, in step 106, the work is arranged in a predetermined range including a focal position of the measurement laser beam in a Z-direction and it is decided whether or not the emitted light quantity and the reflected light quantity are measured in each arrangement position. When measurement is not made in the predetermined rang; the work is arranged in a predetermined range of the Z-direction in step 115 and the flowchart returns to step 104 of measurement. When the measurement is made in the predetermined range, in step 107, an approximate curve is created from the corrected light quantity corresponding to each position of the work and a point at which the corrected light quantity becomes maximum in relation to a Z-direction position of the work is specified and the Z-direction position of a focal point F is detected. The Z-direction position of the focal point of the measurement laser beam at this time represents a height of the work in the X and Y-directions. Then, in step 108, the work height and measurement positions of the X and Y-directions are stored. It is decided whether or not measurement of the work height ends in an XY-direction region of performing measurement and processing in step 109, and when the measurement does not end, the flowchart returns to step 102. When the measurement ends, the work is moved from the focal position measured result to a focal distance suitable for mold thickness measurement or the height of the work in step 110. Then, in step 111, in order to monitor the residual thickness of the mold, the measurement laser beam is emitted from the laser light source and the emitted light quantity and the reflected light quantity are measured. Using the emitted light quantity measured in step 111, the reflected light quantity is normalized and is set as a corrected value and also the corrected value and measurement positions of the X, Y and Z-directions are stored in step 112. Then, it is decided whether or not measurement of the mold residual thickness ends in the XY-direction region of performing measurement and processing in step 113. When the measurement does not end, the flowchart returns to step 110. It is decided whether or not all the corrected values are more than or equal to a set value set according to the residual mold thickness in step 114, and when all the corrected values are more than or equal to the set value, the flowchart ends in step 115. When there is the corrected value which is less than the set value, a processing condition is set according to the corrected value in each XY-direction position in step 117. The processing condition is changed in step 118. In step 119, the work is moved to a focal distance suitable for mold processing or the height of the work and X and Y coordinates set so as to perform the processing on the changed processing condition. In step 120, laser processing is performed. Then, it is decided whether or not the processing ends in all the XY-direction regions set so as to perform the processing on the same processing condition in step 120. When the processing does not end, the flowchart returns to step 119. It is decided whether or not the processing ends in all the regions in which the corrected value<the set value is satisfied in step 122. When the processing does not end, the flowchart returns to step 118 and when the processing ends, the flowchart returns to step 102.

EXAMPLE 3

In the Examples 1 and 2 described above, the IC chip is placed at the position toward which the measurement laser beam is emitted and the step of measuring the heightwise position of the mold by the measurement laser beam is provided, but the step of measuring the heightwise position of the mold may be omitted by accumulating previously measured heights in a database as shown in the following Example 3.

Figure 14:
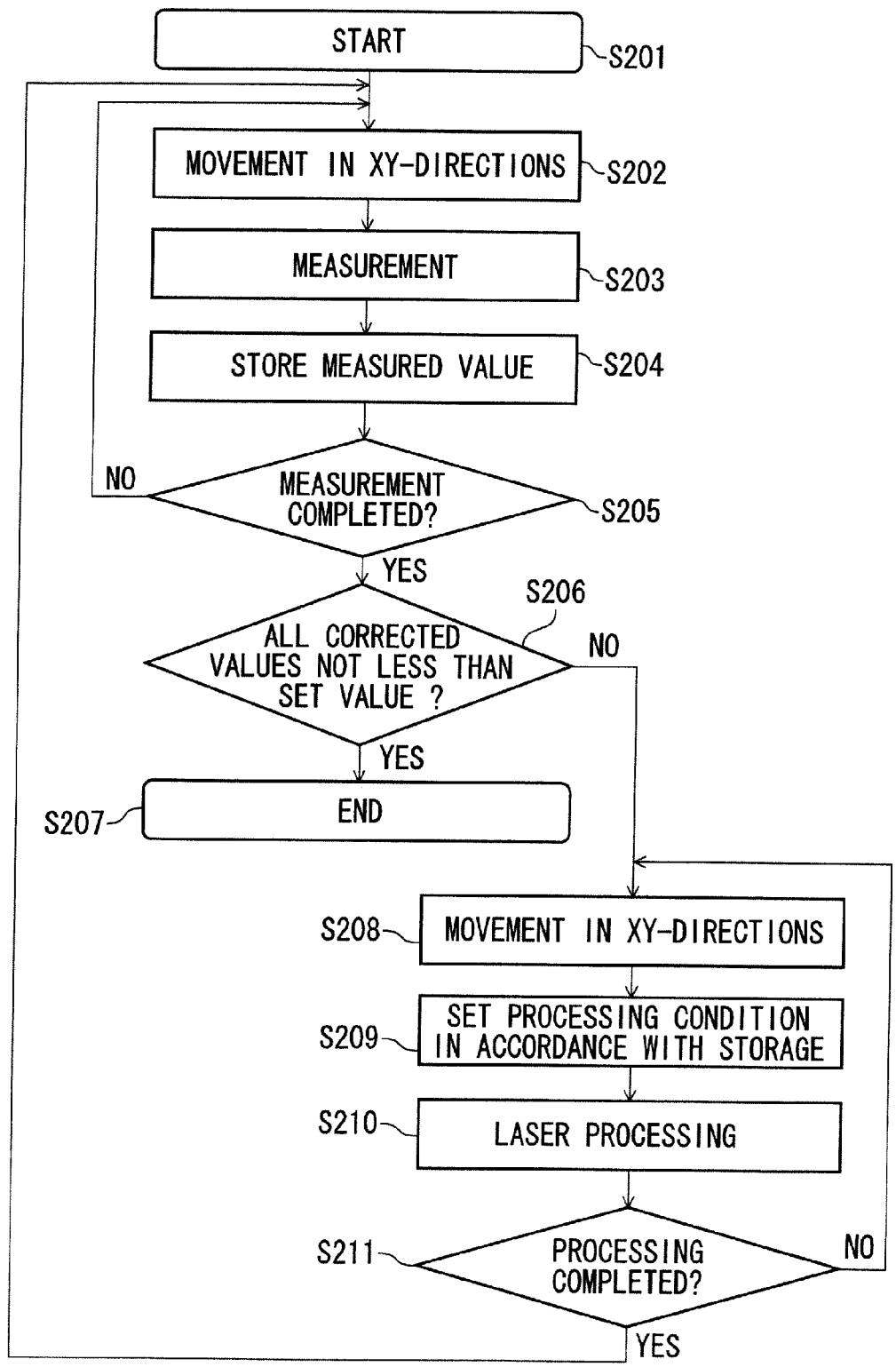
FIG. 14 is a flowchart showing a third example of removing a mold using a laser processing apparatus.

FIG. 14 is a flowchart showing a third example showing a method for removing a resin mold.

First, in step 202, work is moved in X and Y-directions by a moving mechanism and the work is arranged in a position in which laser beam emitted from a laser light source is applied. Next, in step 203, in order to monitor the residual thickness of a mold, the measurement laser beam is emitted from the laser light source and an emitted light quantity and a reflected light quantity are measured. The reflected light quantity is normalized and is set as a corrected value using the measured emitted light quantity in step 204. Also, the corrected value and measurement positions of X and Y-directions are stored. It is decided whether or not measurement of the mold residual thickness ends in an XY-direction region of performing measurement and processing in step 205. When the measurement does not end, the flowchart returns to step 202. It is decided whether or not all the corrected values are more than or equal to a set value set according to the residual mold thickness in step 206. When all the corrected values are more than or equal to the set value, the flowchart ends in step 207. When there is the corrected value which is less than the set value, the work is moved in the X and Y-directions and the work is arranged in the position in which the laser beam emitted from the laser light source is applied in step 208. Then, in step 209, a processing condition is changed according to the corrected value in each XY-direction position stored. In step 210, laser processing is performed. It is decided whether or not the processing ends in all the regions in which the corrected value<the set value is satisfied in step 211. When the processing does not end, the flowchart returns to step 208 and when the processing ends, the flowchart returns to step 202.

FIG. 15 shows a state in which an IC 60 is inclined obliquely and is disposed inside a resin mold 62. First, a laser for measurement for measuring a position of an IC chip and a laser for processing for removing the resin mold are used. In the case of being unsealed from the upper portion of the IC chip 60, measurement laser beam is applied and a thickness (Z-direction) of the resin mold on the IC chip is measured and laser processing is performed and the mold is removed and a cavity 61 is formed.

FIG. 15 is a schematic view showing a removal state in the case of shifting from (step 13) to (step 18) of the resin mold removal step in Example 1, a removal state in the case of shifting from (step 22) to (step 2) of the resin mold removal step in Example 2 and a removal state in the case of shifting from (step 11) to (step 2) of the resin mold removal step in Example 3. Here, numeral 63 shows a large rough processing region by a laser and numeral 64 shows a middle rough processing region by the laser and numeral 65 shows a small rough processing (finish processing) region by the laser, respectively.

Figure 15A:
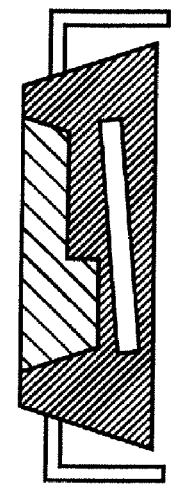
FIGS. 15a-15F are sectional diagrams in which a mold is taken off y laser processing.
Figure 15B:
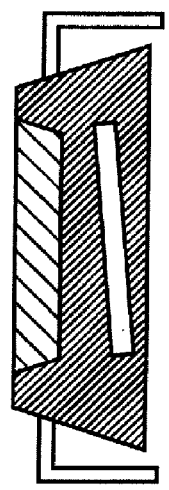
Figure 15C:
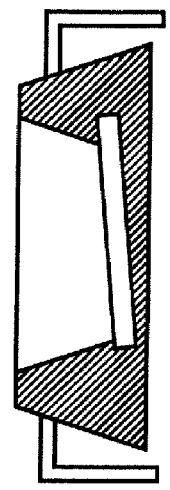
Figure 15D:
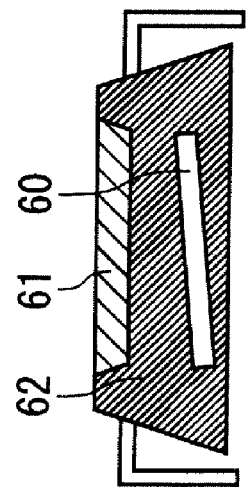
Figure 15E:
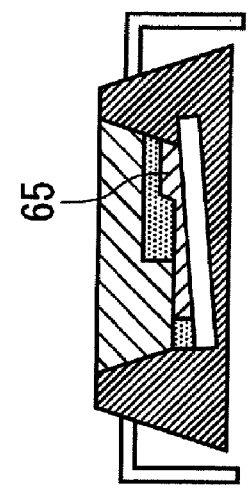
Figure 15F:
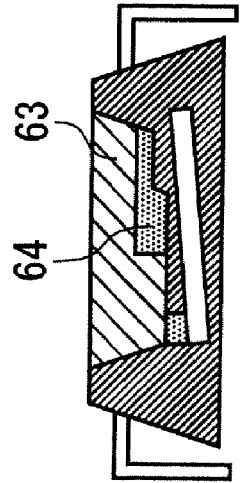

FIGS. 15(a) and 15(b) show the large rough processing region by the laser. The resin mold 33 is gradually removed and a coating of the whole thickness of the resin mold 33 becomes thin. FIGS. 15(c) to 15(e) show each of the regions in which large rough processing by the laser, middle rough processing by the laser and small rough processing by the laser are performed in consideration of various sizes of thickness of the resin mold. By performing the large rough processing by the laser, the middle rough processing by the laser and the small rough processing by the laser in consideration of various sizes of thickness of this resin mold, the resin mold is completely removed on the IC chip and a state of opening the IC chip is obtained (FIG. 15(f)).

According to the invention as described in the above Examples, using the fact that the IC chip such as the transistor, the diode, the resistor or the capacitor differs from the plastic mold with which this IC chip is covered in reflectance of laser beam, the reflectance of the laser applied to the surface of the plastic mold changes, so that the thickness of the mold can be measured by measuring the reflected light quantity of the measurement laser beam reflected by the processing object.

Therefore, the plastic mold can be unsealed at high speed without damaging the IC chip. Also, even when an IC sample is inclined and installed or the chip is inclined and is present inside the mold, the IC chip is not damaged.

While the present invention has been described in detail with reference to specific embodiments, it is apparent to those skilled in the art that various changes and modifications can be made therein without departing from the spirit and scope of the invention.

The present application is based on Japanese Patent Application (Patent Application No. 2007-304584) filed on Nov. 26, 2007, the content of which is incorporated herein by reference.

INDUSTRIAL APPLICABILITY

The present application is used for unsealing an IC package for taking out a broken semiconductor chip.

The invention claimed is:

1. A mold removing method comprising:
    placing an IC chip covered with a molded member at a position toward which a measurement laser beam is emitted;
    irradiating the molded member with the measurement laser beam to measure an emitted light quantity toward the molded member and a reflected light quantity from the molded member;
    measuring a thickness of the molded member using the reflected light quantity from the molded member;
    obtaining a corrected value by normalizing the reflected light quantity from the molded member using the emitted light quantity toward the molded member, and comparing the corrected value with a set value, which is preset in accordance with the thickness of the molded member, to obtain a removal quantity of a mold to be removed in terms of a heightwise position of the molded member; and
    changing a laser emission condition based on the removal quantity of the mold and removing the molded member by laser processing.

2. The mold removing method according to claim 1, comprising irradiating the molded member with the measurement laser beam to measure the heightwise position of the molded member.

3. The mold removing method according to claim 1, comprising adjusting the heightwise position of the molded member.

4. The mold removing method according to claim 3, wherein the adjusting the heightwise position of the molded member comprises creating an approximate curve from a corrected light quantity corresponding to each position of the molded member and detecting a focal position such that the corrected light quantity becomes maximum in positional relation to a position direction of the molded member.

5. A mold removing method comprising:
    placing an IC chip covered with a molded member at a position toward which a measurement laser beam is emitted;
    emitting the measurement laser beam to measure an emitted light quantity toward the molded member and a reflected light quantity from the molded member in each position of the molded member;
    calculating a corrected light quantity from the emitted light quantity and the reflected light quantity measured in the each position to measure a heightwise position of the molded member;
    adjusting a heightwise position of the molded member;
    obtaining a corrected value by normalizing the reflected light quantity from the molded member using the emitted light quantity toward the molded member, and comparing the corrected value with a set value, which is preset in accordance with a thickness of the molded member, to obtain a removal quantity of a mold to be removed in terms of the heightwise position of the molded member; and
    changing a laser emission condition based on the removal quantity of theee mold and removing the molded member by laser processing.

6. The mold removing method according to claim 5, wherein the adjusting the heightwise position of the molded member comprises creating an approximate curve from the corrected light quantity corresponding to the each position of the molded member and detecting a focal position such that the corrected light quantity becomes maximum in position relation to a position direction of the molded member.

* * * * *